United States Patent
Hytch et al.

(10) Patent No.: US 8,502,143 B2
(45) Date of Patent: Aug. 6, 2013

(54) METHOD, DEVICE AND SYSTEM FOR MEASURING NANOSCALE DEFORMATIONS

(75) Inventors: Martin Hytch, Toulouse (FR); Etienne Snoeck, Toulouse (FR); Florent Houdellier, Calmont (FR); Florian Hue, Paris (FR)

(73) Assignee: Centre National de la Recherche Scientifique, Paris (FR)

( * ) Notice: Subject to any disclaimer, the term of this patent is extended or adjusted under 35 U.S.C. 154(b) by 554 days.

(21) Appl. No.: 12/680,078

(22) PCT Filed: Sep. 17, 2008

(86) PCT No.: PCT/FR2008/001302
§ 371 (c)(1), (2), (4) Date: May 13, 2010

(87) PCT Pub. No.: WO2009/068763
PCT Pub. Date: Jun. 4, 2009

(65) Prior Publication Data
US 2010/0252735 A1    Oct. 7, 2010

(30) Foreign Application Priority Data

Sep. 25, 2007  (FR) .................................... 07 06711
Mar. 26, 2008  (FR) .................................... 08 01662
May 19, 2008  (FR) .................................... 08 02685

(51) Int. Cl.
*G01N 23/00*     (2006.01)

(52) U.S. Cl.
USPC ........................... 250/307; 250/306; 250/311

(58) Field of Classification Search
USPC ..... 250/306, 307, 311, 550; 356/457; 359/29, 359/31; 382/210
See application file for complete search history.

(56) References Cited

U.S. PATENT DOCUMENTS 4,935,625 A * 6/1990 Hasegawa et al. ................. 850/9
5,192,867 A * 3/1993 Osakabe et al. ............... 250/311

(Continued)

FOREIGN PATENT DOCUMENTS

| EP | 1 508 801 | 2/2005 |
| JP | 2005-294085 | 10/2005 |
| JP | 2008-021626 | 1/2008 |

OTHER PUBLICATIONS

Auvray et al., "Caracterisation par diffraction X des superreseaux GaAlAs-GaAs. Importance des techniques et de la procedure utilisees," *Revue de Physique Appliquee*, vol. 24, No. 7, Jul. 1, 1989, pp. 711-720.

(Continued)

*Primary Examiner* — Robert Kim
*Assistant Examiner* — Jason McCormack
(74) *Attorney, Agent, or Firm* — Alston & Bird LLP

(57) ABSTRACT

A method is provided that includes the steps of i) providing a specimen in the form of a wafer having a measurement area and a reference area, assumed to be without deformations and coplanar with the measurement area; ii) illuminating one face of the specimen with an electron beam ($F^{in}$); iii) superposing a beam ($F^1_B$) of radiation diffracted by the measurement area (B) with a beam ($F^1_A$) of the radiation diffracted by the reference so as to cause these two beams to interfere; iv) measuring the spatial periodicity and the orientation of the fringes of the interference pattern (FI); and v) deducing from this a difference in the lattice parameter and/or the orientation between the reference and measurement areas, which is indicative of a state of deformation of the latter at the nanoscale. A device and system for implementing the method is also provided.

14 Claims, 5 Drawing Sheets

U.S. PATENT DOCUMENTS

| | | | |
|---|---|---|---|
| 5,298,747 A * | 3/1994 | Ichikawa et al. | 850/9 |
| 5,671,042 A * | 9/1997 | Sciammarella | 356/35.5 |
| 5,767,521 A * | 6/1998 | Takeno et al. | 250/492.2 |
| 5,828,724 A * | 10/1998 | Kurtz | 378/70 |
| 7,420,687 B2 * | 9/2008 | Pfaff | 356/457 |
| 7,504,625 B2 * | 3/2009 | Yamazaki | 250/310 |
| 7,609,391 B2 * | 10/2009 | Betzig | 356/521 |
| 7,750,298 B2 * | 7/2010 | Harada et al. | 250/311 |
| 2002/0084412 A1 | 7/2002 | Tomita | |
| 2003/0016364 A1 * | 1/2003 | Thomas et al. | 356/457 |
| 2003/0122075 A1 * | 7/2003 | Voelkl | 250/311 |
| 2003/0201393 A1 | 10/2003 | Tsuneta et al. | |
| 2004/0144923 A1 * | 7/2004 | Tanji | 250/311 |
| 2004/0195506 A1 | 10/2004 | Wang et al. | |
| 2006/0065830 A1 * | 3/2006 | Bauer et al. | 250/307 |
| 2006/0097167 A1 * | 5/2006 | Domenicucci et al. | 250/311 |
| 2007/0227258 A1 * | 10/2007 | Soeda | 73/800 |

OTHER PUBLICATIONS

Nikulin et al., "Inversion in x-ray Bragg diffraction: A practical technique to compensate fy dynamical scattering features," *J. Appl. Phys.*, vol. 82, No. 3, Aug. 1, 1997, pp. 989-993.

Rodenburg, "Understanding Transmission Electron Microscope Alignment: A Tutorial," *Microscopy and Analysis*, vol. 18, No. 3, May 8, 2004, pp. 9-11.

Hanszen, "Methods of off-axis electron holography and investigations of the phase structure in crystals," *J. Phys. D: Appl. Phys.*, vol. 19, No. 3, Mar. 14, 1986, pp. 373-395.

Search Report for Application No. PCT/FR2008/001302 dated May 26, 2009.

Bohr, M., *Intel's 90 nm Logic Technology Using Strained Silicon Transistors*, Intel, Dec. 2003, pp. 1-10.

Foran, B. et al., *Strain Measurement by Transmission Electronic Microscopy*, Metrology/Failure Analysis, Section 8, Future FAB International, Issue 20, pp. 127-129 (undated).

Hirsch, P. et al., *Electron of Microscopy of Thin Crystals*, Krieger Publishing Co., Inc. 1$^{st}$ Ed. 1965, pp. 343-352.

Hue, F. et al., *Calibration of Projector Lens Distortions*, Journal of Electron Microscopy Advance Access, Aug. 2005, pp. 1-10.

Hytch, M. J. et al., *Quantitative Measurement of Displacement and Strain Fields from HREM Micrographs*, Ultramicroscopy 74, (1998), pp. 131-146.

Ishitani, T. et al., *Improvements in Performance of Focused Ion Beam Cross-Sectioning: Aspects of Ion-Sample Interaction*, Journal of Electron Microscopy, 53(5), (2004), pp. 443-449.

Schofield, M. A. et al., *Characterization of JEOL 2100F Lorentz-TEM for Low-Magnification Electron Holography and Magnetic Imaging*, Ultramicroscopy, (2007), 10 pages.

Snoeck, E. et al., *Using a CEOS—Objective Lens Corrector as a Pseudo Lorentz Lens in a Tecnai F20 TEM*, IMC16, Sapporo, (2006), 1 page.

Treacy, M. M. J. et al., *On Elastic Relaxation and Long Wavelength Microstructures in Spinodally Decomposed $In_xGa_{1-x}As_yP_{1-y}$ Epitaxial Layers*, Philosophical Magazine A vol. 51 No. 3, (1985), pp. 389-417.

\* cited by examiner

METHOD, DEVICE AND SYSTEM FOR MEASURING NANOSCALE DEFORMATIONS

FIELD OF THE INVENTION

The invention relates to a method for measuring nanoscale deformations in a crystal specimen. The invention also relates to a device and to a system for implementing such a method.

The method, the device and the system of the invention aim to enable "mapping" of the stresses in a crystal with a spatial resolution of the order of a few nanometers. At this scale, the deformations caused by stresses are reflected in deformations of the crystal lattice of the specimen.

BACKGROUND

The measurement of nanoscale deformations has various technological applications. Currently, the most important relates to the mapping of stresses in transistors based on strained silicon technology. This technology, which makes it possible to increase the working frequency of microelectronic devices, is presented in the document "Intel's 90 nm Logic Technology Using Strained Silicon Transistors", M. Bohr, available on the Internet at the address: http://www.intel.com/research/downloads/Bohr-Strained-Silicon-120403.pdf.

The conventional methods of measuring deformations of a specimen, based on optical holography for example, do not allow nanoscale spatial resolutions to be attained. The techniques known from the prior art and having sufficient resolution are based on transmission electron microscopy, either in diffraction mode or in imaging mode. These techniques are described in a general manner in the article by B. Foran et al., "Strain Measurement by Transmission Electron Microscopy", Future Fab International, 20 (2006) 127.

Among the techniques based on electron diffraction it is possible to mention CBED (Convergent Beam Electron Diffraction), LACBED (Large Angle Convergent Beam Electron Diffraction) and NBD (Nano-Beam Diffraction). The first two techniques have the drawback of providing information about deformation of the specimen studied only through comparison of the measurement data and the results of a simulation: the measurements are therefore indirect and depend heavily on the parameters chosen for the simulation. The latter technique lacks precision. Furthermore, these techniques meet with difficulties when the gradient of the deformations is too great, for example in the channel of a strained silicon transistor. In addition, the measurements are punctiform, or at most carried out in a row, and must therefore be repeated several times to allow the deformations of a specimen to be mapped in two dimensions.

The imaging technique based on diffraction contrast (QEDC) suffers from similar drawbacks.

By contrast, other imaging techniques, such as High Resolution Transmission Electron Microscopy (HRTEM), have the advantage of being "direct" and of not depending on a particular choice of simulation parameters. However, these techniques only provide an image of the crystal lattice at the nanoscale; determining a state of deformation assumes the availability of a reference lattice. Yet in order to image a crystal lattice, it is necessary to enlarge it very greatly (by a factor of around $5 \times 10^5$), which means that the field of view is necessarily narrow (of around 100-150 nm). It is therefore not possible, in general, to view at the same time a deformed region and a region without deformation that is able to serve as a reference.

Furthermore, all these techniques (and more particularly HRTEM) work satisfactorily only with very thin specimens, a few tens of nanometers thick at most for HRTEM. Yet, when a wafer that thin of a bulky structure is extracted, the stresses relax significantly. The deformations measured in the specimen are therefore no longer representative of those present in the original structure. This problem is well known in the art: see, for example, the article by M. M. J. Treacy et al. "On Elastic Relaxation and Long Wavelength Microstructures in Spinoidally Decomposed $In_xGa_{1-x}As_yP_{1-y}$ Epitaxial Layers", Philos. Mag. A 51 (1985) 389.

SUMMARY

The invention aims to make a technique available for measuring crystal deformations of a specimen with a nanoscale spatial resolution that does not have at least some of the drawbacks of the prior art.

One subject of the invention is therefore a method for measuring nanoscale deformations in a portion of a crystal specimen as claimed in claim 1, said method being characterized in that it comprises steps consisting in:
  i) preparing a crystal specimen in the form of a wafer with approximately parallel faces, said specimen comprising a first area, called the measurement area, of which the crystal deformations are to be measured, and a second area, called the reference area, assumed to be without deformations and coplanar with the first area;
  ii) illuminating one face of said specimen with a spatially coherent beam of radiation capable of being diffracted by the crystal lattice of the specimen;
  iii) superposing a beam of radiation diffracted by the measurement area of the specimen with a beam of the same radiation diffracted, to the same order, by the reference area so as to cause these two diffracted beams to interfere at a plane called the image plane;
  iv) measuring the spatial periodicity and the orientation of the fringes of the resulting interference pattern; and
  v) deducing from this a difference in the lattice parameter and/or the orientation between said reference and measurement areas, which is indicative of a state of deformation of the latter at the nanoscale.

Particular embodiments of the method of the invention are the subject of the dependent claims 2 to 12.

Another subject of the invention is a system for measuring nanoscale deformations in a portion of a crystal specimen by such a method. Such a system, which is the subject of claim 13, is characterized in that it comprises: a support for a crystal specimen in the form of a wafer with approximately parallel faces; illumination means for illuminating one face of said specimen with a spatially coherent beam of radiation capable of being diffracted by the crystal lattice of the specimen; an optical assembly for superposing a beam of radiation diffracted by a first area of the specimen with a beam of the same radiation diffracted, to the same order, by a second area, coplanar with said first area, so as to cause these two diffracted beams to interfere at a plane called the image plane; a means for measuring the spatial periodicity of the fringes of the resulting interference pattern; and a data processing means for calculating, from said spatial periodicity, a difference in the lattice parameter between said first and second areas of the specimen, which is indicative of a state of deformation of one of these areas relative to the other at the nanoscale.

Such a system can be produced using a conventional electron microscope. However, this solution is not fully satisfactory, in particular when it is hoped to measure the deformations in a relatively large area of a specimen (several μm²). Another subject of the invention is therefore an electron optical device comprising: a pair of beam-deflecting coils; insertion means for placing a specimen in the path of an electron beam that has passed through said pair of deflecting coils; a first electromagnetic lens for forming an image of said specimen; and a diaphragm positioned in the image focal plane of said first lens and centered on the optical axis of the latter in order to intercept electrons focused by said first lens off said optical axis; and characterized in that said insertion means are designed to allow the positioning of a specimen outside an area of said first electromagnetic lens with a strong magnetic field, upstream of said lens relative to the propagation direction of said electron beam.

BRIEF DESCRIPTION OF THE DRAWINGS

Further features, details and advantages of the invention will emerge on reading the description with reference to the appended drawings, provided by way of example and which respectively show.

DETAILED DESCRIPTION

Figure 1:
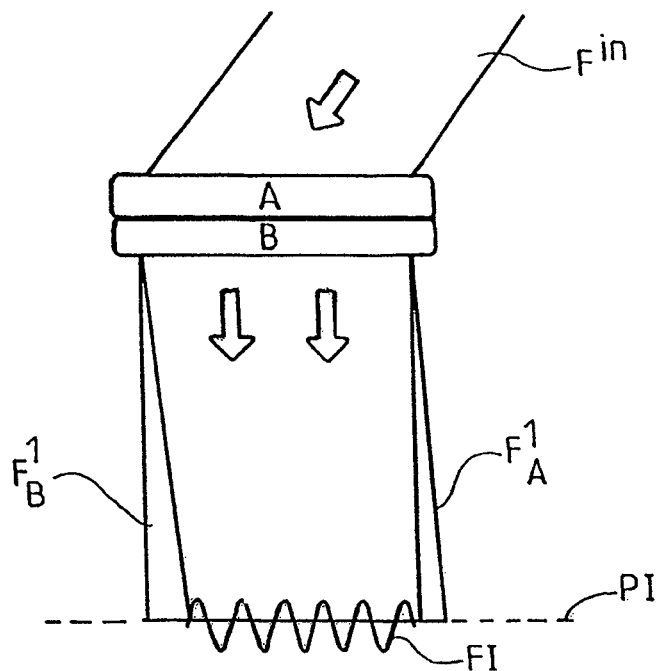
FIG. 1, a schematic diagram of a method for measuring crystal deformations by observing "moiré fringes"

FIG. 1 shows a schematic diagram of a technique, known in particular from the work of P. B. Hirsch et al. "Electron Microscopy of Thin Crystals", 2nd edition, Krieger, Malabar Fla., 1977, Chapter 15, which makes it possible to demonstrate differences between the crystal lattices of two materials.

To implement this technique, a stack must be produced of two specimens (A and B) of the materials whose crystal lattices are to be compared. This stack is illuminated by a spatially coherent electron beam $F^{in}$ which passes through it and a portion of which is diffracted by the two crystal lattices. $F^1_A$ refers to the beam diffracted to first order by the specimen A, and $F^1_B$ the beam diffracted to first order by the specimen B. The portion of radiation that is diffracted by both specimens is neglected, and neither zero-order transmission nor higher orders of diffraction are considered of interest.

If the crystal lattices of the specimens A and B are not identical, the beams $F^1_A$ and $F^1_B$ propagate in different directions and interfere with one another. By measuring the spatial periodicity of the interference pattern FI in an image plane PI, it is possible to obtain information about the difference between the scattering vectors in A and in B. From this information, the difference between the lattice parameters of the two specimens (or rather, a component of this difference, which is a vector quantity) is deduced.

In principle, this technique may be applied to the mapping of deformations in a material. To do this, it would be necessary to superpose two specimens of the same material, one having a field of deformations to be characterized and the other, assumed not to be deformed, used as a reference. However, in practice, such an application would come up against virtually insurmountable difficulties. Specifically, it is not simple to prepare a stack of specimens having the necessary configuration. In addition, in order to be able to interpret the results correctly, it would be necessary to know the relative orientation of the crystal lattices of the two specimens very precisely.

Furthermore, if the deformations of the crystal lattice are relatively small (of the order of a few percent), the interference fringes will be very widely spaced apart, and as a result the spatial resolution of the measurement will be poor. For example, in the case of (111) planes of silicon, a deformation of 1% would produce fringes 30 nm wide, which would yield a spatial resolution of about 60 nm.

The method of the invention is also based on the observation of interference fringes between electron beams diffracted by a deformed crystal lattice and by a reference lattice, but uses an experimental configuration that is easier to implement and enables better spatial resolution to be attained.

Figure 2:
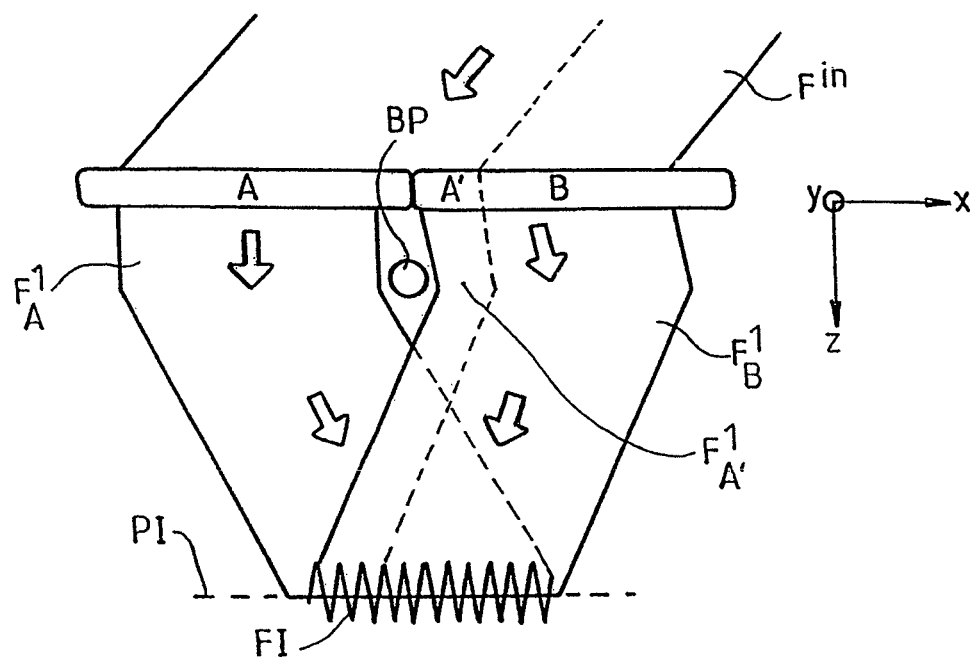
FIG. 2, a schematic diagram of the method of the invention.

The basic idea of the invention, shown in FIG. 2, consists in positioning the two crystal areas, that whose stresses (A) are to be mapped and that serving as a reference (B), side by side. The beams diffracted by the two areas $F^1_A$ and $F^1_B$ are then converged onto a detection screen positioned in an image plane PI with the help of a deflection device BP, for example an electrostatic biprism.

The new configuration is advantageous because it eliminates the problems linked with the misalignment of the crystal lattices of the two areas to be compared. Furthermore, the specimens are easier to prepare: it suffices, for example, to extract a "slice" of a semiconductor substrate, on the surface of which an electronic transistor device is produced, the cutting plane being perpendicular to said surface. In this case, the surface electronic device constitutes the area to be measured and the deeper part of the substrate forms the reference area. It is known how to cut such slices, with the desired level of precision and a thickness of around 100 nm or more, with focused ion beam technology. See, for example, the article by T. Ishitani, K. Umemura, T. Ohnishi, T. Yaguchi and T. Kamino "Improvements in Performance of Focused Ion Beam Cross-Sectioning: Aspects of Ion-Sample Interaction", Journal of Electron Microscopy 53 (2004), 443-449.

The technique of the invention may be applied to specimens in the form of wafers with parallel plane faces and a relatively high thickness, by way of indication between 50 and 600 nm and preferably between 100 and 300 nm (to be compared with the 10 nm of HRTEM technology), which reduces the problem of the relaxation of stresses. This is due to the fact that only one diffraction order of the radiation beam is selected, which limits the increase in background noise due to all the scattering of said radiation by the specimen. Contrast is improved in relation to HRTEM technology because of the greater separation of the fringes, which are therefore easier to image.

Conversely, it is necessary for the specimen to be of constant thickness with good precision (better than 15%, preferably better than 5%), but this may be obtained relatively simply through the aforementioned focused ion beam technology.

The use of a biprism deflection device to converge the beams $F^1_A$ and $F^1_B$ also has the advantage of increasing the angle between said beams. This results in interference fringes with a spatial period less than the "conventional" moiré technique (FIG. 1) and consequently better spatial resolution of the measurement. By way of example, the beams $F^1_A$ and $F^1_B$ may form between them an angle, relative to the plane of the specimen (object plane), of between 1 and 20 mrad (milliradians). The angle "relative to the plane of the specimen" is the real angle formed by the beams when they interfere at the detector (image plane), multiplied by the magnification of the projection system generally positioned upstream of the latter (lenses 15, 16 in FIG. 3).

A mathematical description of the principle of the technology of the invention will now be provided (the symbols in bold characters represent vector quantities).

Let $k_0$ be the wave vector of the electron beam $F_{IN}$ incident on the specimen and $g_A$, $g_B$ the reciprocal lattice vectors corresponding to the crystal planes responsible for the diffraction in the areas A and B respectively. It is known from diffraction theory that the wave vectors of the beams $F^1_A$ and $F^1_B$, designated $k_A$ and $k_B$, are given by: $k_A = k_0 + g_A$ and $k_B = k_0 + g_B$; the angles of diffraction associated with the vectors $g_A$, $g_B$ are generally around 2-40 mrad and typically between 8 and 20 mrad. The action of the biprism BP on these beams can be represented by an additional wave vector $q_c$; assuming a symmetric deflection action it is possible to write, after the biprism, $k_A = k_0 + g_A + 1/2 q_c$ and $k_B = k_0 + g_B - 1/2 q_c$. In the image plane PI, the superposition of the two beams produces an interference pattern, the periodicity of which (defined as being equal to the reciprocal of the period) is given by $k_H = k_B - k_A = g_B - g_A - q_c$. If the value of $q_c$ is known, $g_B - g_A$ can be deduced, which characterizes the deformation of the crystal lattice in the "measurement" area B in relation to that of the reference area A. In itself this vector is not very informative. For example, it does not enable a change in the lattice parameter (due to a compression or expansion) to be distinguished from a rotation of the lattice. To be able to exploit the measurement result, it is generally necessary to know, in addition, the direction and the modulus of the vector $g_A$ (reciprocal lattice vector of the reference area). This is done without particular difficulty by observing the diffraction pattern produced by the reference area at infinity (in concrete terms, in the plane of the diaphragm 14 of the device shown in FIG. 3), which yields the direction. The modulus can be calculated from the known parameters of the crystal A and related to the image plane by taking account of the magnification.

Measurement of the periodicity and the orientation of interference fringes does not pose particular difficulties: it suffices to acquire an image of the interference pattern using an appropriate sensor, such as a CCD array, convert it into a digital format, then mathematically process the image. Such processing may be based, for example, on the method of Geometrical Phase Analysis (GPA), known from the article by M. J. Hÿtch et al., "Quantitative Measurement of Displacement and Strain Fields from HREM Micrographs", Ultramicroscopy 74 (1998), 131, see in particular subsections 2.2 and 3. Although other methods of analysis may also be used, the GPA method is particularly advantageous. For this reason, its use will be described in detail.

First, the Fourier transform of the interference pattern is calculated. Next, only the part of this Fourier transform corresponding to the periodicity of the holographic fringes, (approximately) equal to $q_c$, is selected using a mask that has a width of the order of this periodicity. The inverse Fourier transform of this selected area provides a complex two-dimensional signal, the phase of which is called the "raw-phase image" and contains all the information relating to the deformation of the area B of the specimen that can be obtained by the method of the invention. In particular, the derivative of the phase yields the periodicity and the local orientation of the fringes.

To correct the distortions of the optical system used to implement the method, it is possible to carry out a reference measurement with a "perfect" crystal, or with reference holograms, the raw phase of which should be a linear function. Any deviation in relation to the linear operation expected is due to the distortions of the optical system and can therefore be subtracted from the raw-phase image of the specimen to be studied, according to the procedure described by Hue et al., "Calibration of Projector Lens Distortions", J. Electron Microscopy 54 (2005), 181-190.

The modulus and the direction of the deflection wave vector $q_c$ constitute important calibration parameters. It is therefore preferable to measure them rather than estimating them on the basis of simulations.

A first possibility for measuring these calibration parameters is to cause the zero-order transmitted beams to interfere, optionally in the absence of the specimen. It is easily understood that the measurement of the fringe periodicity directly yields the modulus of $q_c$ while their orientation yields its direction.

The method may also comprise a calibration step (vi) comprising measuring the change in direction of the diffracted beam(s) introduced by the deflection device, and using information obtained during step v) of determining a difference in the lattice parameter between said reference and measurement areas.

In one embodiment, the calibration step may comprise the following individual steps:

vi-a) two spatially distinct parts of the same beam diffracted by only one of the areas of the specimen are superposed to cause them to interfere at the image plane; and vi-b) measurement is carried out of the spatial periodicity and the orientation of the fringes of the resultant interference pattern, which constitute the calibration information sought In a further embodiment, the calibration step may comprise the following during the calibration step:

vi-a') a coherent radiation beam is generated which is approximately identical to that used for the crystal deformation measurement;

vi-b') using the deflection device a nondiffracted component of the beam is decomposed into two parts that are superposed and interfere at the image plane;

vi-c') measurement is carried out of the spatial periodicity and the orientation of the fringes of the interference pattern, which constitute the calibration information sought.

In some embodiments the step of determining a difference in the lattice parameter between the reference and measurement areas may further include calculating, from the measurement of the spatial periodicity and the orientation of the interference fringes, a difference between the components of the wave vectors of the beams diffracted by the measurement area and by the reference area;

determining, during said calibration step vi), a component of a wave vector representing the deflection introduced by the device; and substracting of the component of the wave vector representing the deflection introduced by the device from the difference between the components of the wave vector of the diffracted beams;

which yields as a result a difference between the components of reciprocal crystal lattice vectors of the reference and measurement areas, indicative of a deformation in the measurement area at the nanoscale.

Another possibility, shown in FIGS. 2 and 3, consists in positioning the biprism BP in an eccentric manner in relation to the boundary between the reference and measurement areas; for example, in the case of the figures, the wire realizing the biprism is positioned below the reference area. A' designates the part of the reference area located "beyond" the biprism on the side of the area B. In these conditions, the radiation $F^1_{A'}$ diffracted by the region A' interferes with the radiation $F^1_A$ diffracted by the remainder of the reference area A. As $g_{A'}=g_A$, part of the interference pattern will have fringes with spatial periodicity equal to $q_c$. If the GPA method is applied to the method of the invention, the vector $q_c$ will be given by the gradient of the part of the raw-phase image corresponding to the area A'.

A single measurement does not allow the deformation tensor in the specimen studied to be characterized completely. In fact, referring to the cartesian reference system shown alongside FIG. 2, a measurement carried out according to said figure only provides information about the interatomic distance along the axis $g_A$ (which is here assumed to coincide approximately with the X axis).

A two-dimensional field of deformation may be determined by carrying out two successive measurements. It is necessary that the diffraction vectors $g''_A$, $g''_B$ of the diffracted beams selected for the second measurement are not colinear with the corresponding diffraction vectors $g'_A$, $g'_B$ of the first measurement. By deriving corresponding phase images, it is easy to calculate the deformation tensor for the crystal lattice of the measurement area relative to that of the reference area: see the previously cited article by M. J. Hÿtch et al., subsection 4.

A third measurement, carried out by selecting diffracted beams according to diffraction vectors $g'''_A$, $g'''_B$ that are not coplanar with the corresponding vectors of the first and the second measurement, can enable determination of a field of deformation in three dimensions. A correction factor must be applied to the displacement field determined during the third measurement to take account of the fact that the vector $g'''_A$ ($g'''_B$ respectively) is inclined relative to the plane $g'_A$, $g''_A$ ($g'_B$, $g''_B$).

Figure 3:
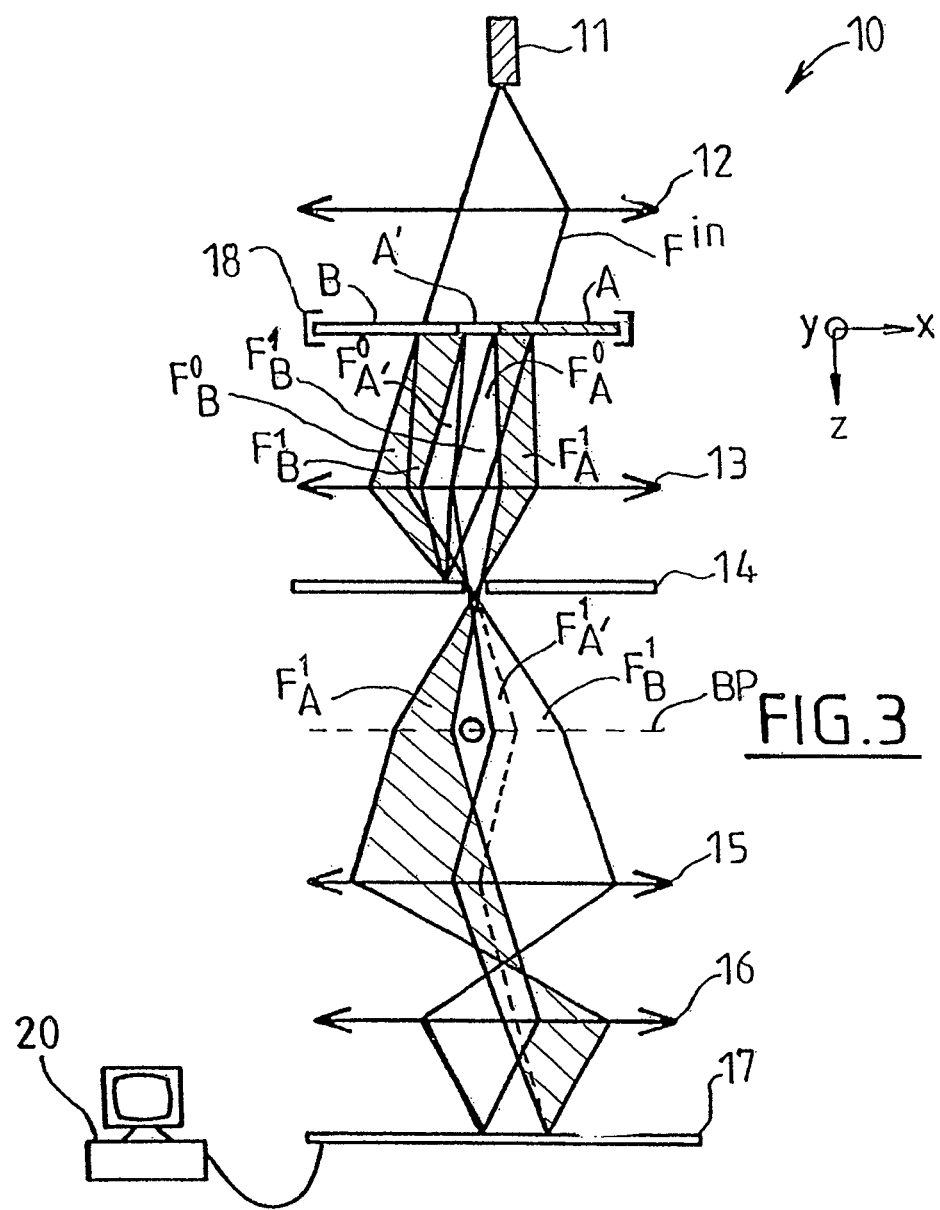
FIG. 3, a schematic diagram of a transmission electron microscopy system for implementing the method of the invention.

FIG. 3 shows a simplified view of a system for implementing the method of the invention.

The system comprises an electron gun 11 for the generation of a spatially coherent electron beam $F^{in}$. After having been collimated by an electromagnetic condenser 12, the beam is directed toward a specimen A/A'/B, held by a specimen holder 18. The angle of incidence of the beam $F^{in}$ on the specimen is chosen so as to allow diffraction of said beam by atomic planes of the crystal.

Downstream of the specimen, a diaphragm 14, lying in the focal plane of an objective lens 13, selects only the first-order diffracted radiation $F_A^1$, $F_{A'}^1$, $F_B^1$ and removes, in particular, the zero-order transmitted radiation $F_A^0$, $F_{A'}^0$, $F_B^0$. The diffracted beams are then deflected by a biprism BP, consisting of a conductive wire charged to a predetermined potential, typically between 40 and 400 volts but depending on, among other things, the energy of the electron beam. The figure shows a device using a simple biprism; the use of multiple biprisms may prove advantageous in order to be able to regulate independently the field of view and the spatial resolution of the measurement.

Next, a system of projector lenses 15, 16 superposes the beams $F_A^1$ and $F_{A'}^1-F_B^1$ in an image plane FI, where an array detector 17 is positioned connected to a means for developing the data 20 which calculates the periodicity of the interference fringes and deduces from this a component of the difference in lattice parameter between the areas A and B of the specimen.

The system of FIG. 3 is based on a transmission electron microscope. Indeed, for technological reasons, the use of electron beams is generally preferred. The physical nature of the radiation used is not of fundamental importance, provided that this radiation has the required spatial coherence and has a wavelength of the same order of magnitude as the lattice parameter of the specimen. Of course, it is also necessary that a beam deflecting device is available. It is therefore possible to conceive embodiments of the invention exploiting the diffraction of X-rays, neutrons, ions and even inert atoms.

A system for implementing the method of the invention may be based on a commercial electron microscope. Yet a microscope of this type generally comprises a main objective lens with a focal length of around 1 mm and high magnification (around 50), which does not permit the performance of measurements at low or medium resolution and with a large field of view.

Consequently, to implement the method of the invention with a sufficiently wide field of view, i.e. of several $\mu m^2$ (hereafter "wide field mode"), it is necessary not to supply the main objective lens and to use, as the objective lens, another lens of the column situated further downstream in the direction of propagation of the electron beam.

This solution is not satisfactory. Specifically:

The arrangement of the microscope column does not generally allow the insertion of a diaphragm in the focal plane of the lens used as the objective lens. Yet a diaphragm is necessary in order to select the first-order diffracted electron beams; to do this, it is therefore obligatory to use the diaphragm of the main objective lens. However, the electron beams are not focused in the plane of this diaphragm; these beams will therefore be cut off asymmetrically at angles that depend on the area of the specimen they have come from. This introduces an off-axis distortion of the image. In addition, in order not to cut off the diffracted beams excessively, it is necessary to make use of a relatively wide diaphragm which does not effectively eliminate the diffused electrons. This results in a reduction in the image contrast.

In wide field mode the optical system of the microscope does not allow a true focused image of the main objective lens diaphragm to be formed. It is therefore difficult to place.

The electron beam diffracted by the specimen must be centered on the optical axis of the microscope and propagate parallel to the latter. This means that the incident beam must be sufficiently inclined. Yet, in wide field mode conventional illumination systems strongly limit the maximum angle of inclination of the incident electron beam, which makes it obligatory to use a very high energy beam for which the diffraction angle is relatively small. Even with this precaution, some specimens remain beyond the range of the method.

The use of a microscope in dual-lens mode (see document U.S. Pat. No. 7,015,469) makes it possible to reduce this latter problem but allows the others to persist.

The electron optical device which constitutes one of the subjects of the invention allows these problems to be solved. Furthermore, this device may also be applied in other bright field electron holography techniques.

As explained further above, such a device comprises: a pair of beam-deflecting coils; insertion means for placing a specimen in the path of an electron beam that has passed through said pair of deflecting coils; a first electromagnetic lens for forming an image of said specimen; and a diaphragm positioned in the image focal plane of said first lens and centered on the optical axis of the latter in order to intercept electrons focused by said first lens off said optical axis; and is characterized in that said insertion means are designed to allow the positioning of a specimen outside an area of said first electromagnetic lens with a strong magnetic field, upstream of said lens relative to the propagation direction of said electron beam.

The various elements of the device are known per se and are found in a conventional electron microscope, but not in the arrangement of the invention. Specifically, in a conventional electron microscope the specimen is situated inside the objective lens, immersed in its magnetic field and not upstream of the latter. The only exception consists of microscopes using, as an objective lens, a lens known as a "Lorentz lens", which is characterized by a virtually zero magnetic field level with the plane of the specimen; see for example K. Tsuno and T. Taoka, Japanese Journal of Applied Physics 22 (1983), 1041. However, used in the context of particular measurements, in particular on magnetic samples, these microscopes do not comprise a diaphragm in the focal plane of the objective lens, and the structure of said objective lens does not allow, in concrete terms, the introduction of such a diaphragm.

There is a need to be more precise concerning the notion of a focal plane of an electromagnetic lens. In principle, the focal length of such a lens is not fixed, but varies depending on the electrical current supplied. In reality, however, spherical and chromatic aberrations are minimized by a determined focal length value and increase rapidly moving away from this value. Consequently, in practice an electromagnetic lens can be used only inside a relatively limited range of focal lengths. In other words, the focal plane of an electromagnetic lens can only move inside a limited spatial region. Moreover, the range of focal distances that can be used must remain compatible with the characteristics of the following lenses in the column and which are in fixed positions.

Figure 4A:
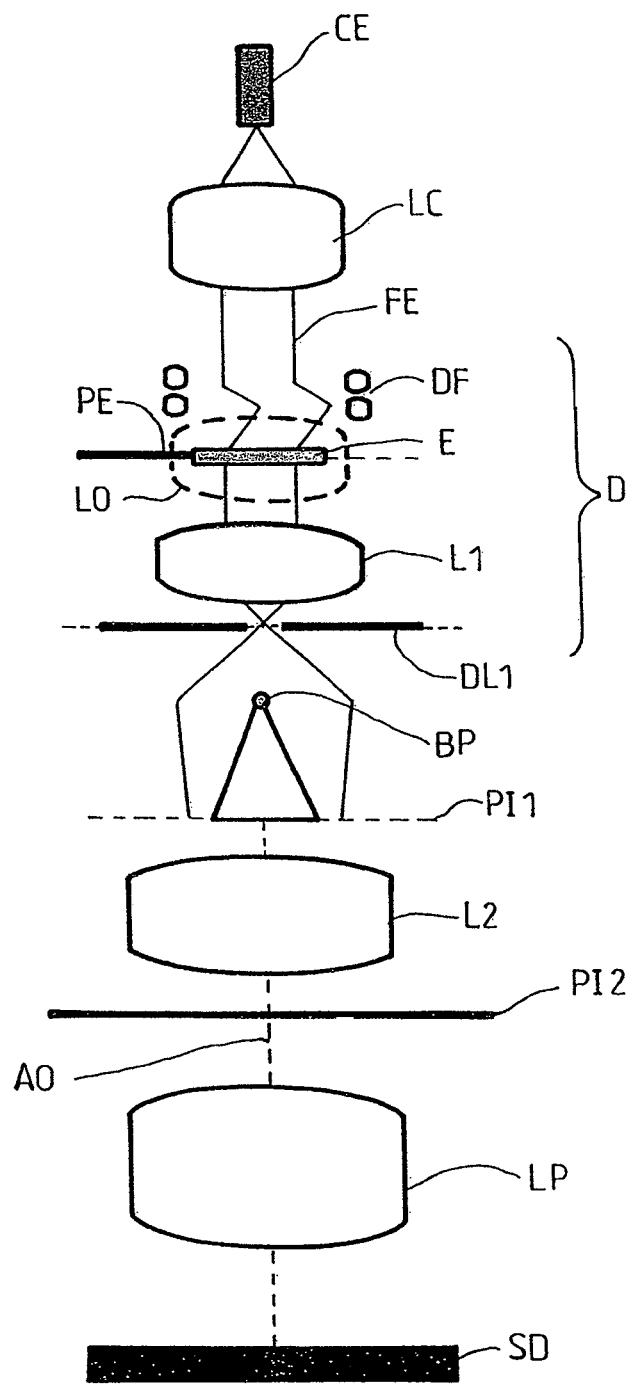
FIG. 4a, a simplified diagram of a transmission electron microscopy system for implementing the method of the invention, comprising an electron optical device according to a first embodiment of the invention.
Figure 4B:
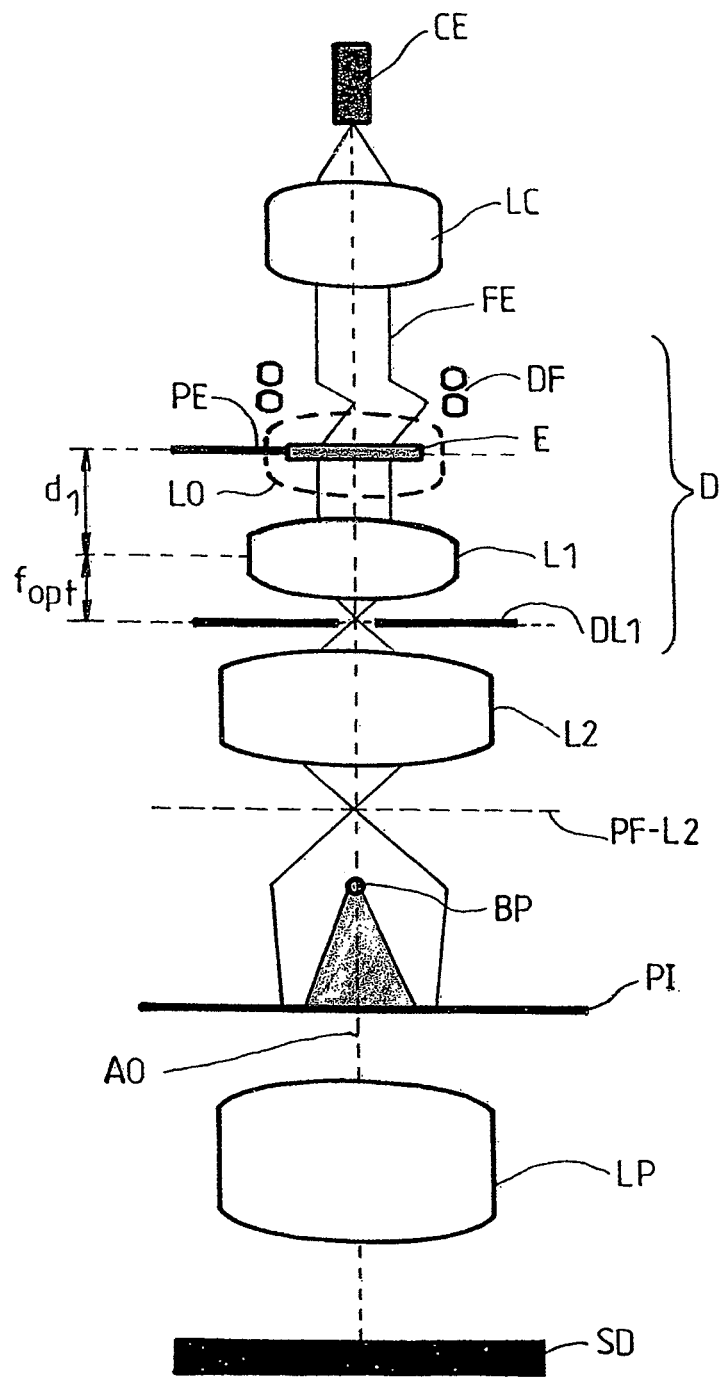
FIG. 4b, a simplified diagram of a transmission electron microscopy system for implementing the method of the invention, comprising an electron optical device according to a second embodiment of the invention.

FIGS. 4a and 4b show how the method of the invention can be implemented using a commercial transmission electron microscope modified by introducing a device according to the invention into its electron column.

As in the case of FIG. 3, a collimated electron beam FE is generated by an electron gun CE coupled to a condenser CE. However, on leaving the condenser, this beam propagates parallel to the optical axis AO of the microscope. A pair of deflecting coils DF (DF1, DF2 in FIG. 5) deflect this beam, while shifting it sideways so that it is incident on the specimen E in a position centered relative to said optical axis. The point corresponding to that at which the deflected beam crosses the optical axis is conventionally called the "pivot point". The current supplying the deflecting coils must therefore be chosen so that their pivot point is positioned on the surface of the specimen.

The concept of the pivot point and the operation of the deflecting coils are explained in detail in the article by John M. Rodenburg "Understanding Transmission Electron Microscope Alignment: A Tutorial", Microscopy and Analysis 18(3), 9-11, 2004.

It is interesting to note that the deflecting coils may be deactivated in order to shift into a "conventional" bright field imaging mode without the electron beam moving sideways, leaving the region of interest.

The respective arrangement of the deflecting coils and of the specimen holder PE is chosen so as to allow sufficient inclination (at least 5 mrad and preferably between 5 and 35 mrad) of the beam FE in wide field mode, in particular by positioning them as close as possible to the object.

In the figures only one pair of deflectors is shown. In practice, however, two pairs will preferably be used, making it possible to deflect the beam in two perpendicular planes.

As explained further above, the angle of inclination of the incident beam is chosen such that the beam first-order diffracted by the specimen is parallel to the optical axis. The angle of inclination $\theta_g$ is therefore given in the small angle approximation by:

$$\theta_g = \lambda/d_g$$

where $\lambda$ is the wavelength of the incident electrons and $d_g$ is the distance between the diffracting atomic planes. For an acceleration voltage of $V_0$ volts, the wavelength $\lambda$ is given by:

$$\lambda(nm) = 1.22639/(V_0 + 0.97845 \times 10^{-6} V_0^2)^{0.5}.$$

The separation of planes (hkl) in a cubic material is given by:

$$d_g = a/\sqrt{(h^2 + k^2 + l^2)}$$

where a is the lattice parameter.

For applications to microelectronics it must be able to observe silicon. The farthest spaced planes, which therefore provide the smallest angles, are {111} planes. If it is wished to be able to measure crystal deformations in the <110> direction with a single hologram, it must be possible to use {220} planes. For the <100> direction, {400} planes must be used.

The table below gives the angles required for the various crystal planes of silicon at three electron energy values.

| Silicon | a = 0.543 nm | 80 kV | 200 kV | 300 kV |
| --- | --- | --- | --- | --- |
|  | $\lambda$ | 4.18 pm | 2.51 pm | 1.97 pm |
|  | $d_g$ |  |  |  |
| {111} | 0.313 nm | 13.3 mrad (0.77°) | 8 mrad (0.46°) | 6.3 mrad (0.36°) |
| {220} | 0.192 nm | 21.8 mrad (1.25°) | 13.1 mrad (0.75°) | 10.3 mrad (0.59°) |
| {004} | 0.136 nm | 30.7 mrad (1.8°) | 18.4 mrad (1°) | 14.5 mrad (0.83°) |

The energy of the electron beam incident on the specimen is generally between 20 keV and 3 MeV, and preferably between 80 keV and 300 keV. In particular, in the case of silicon it is preferable to use electrons of energy less than 140 keV to avoid causing "knock-on" damage, which may in turn cause a relaxation of the stresses that are supposed to be being measured.

For germanium the angles indicated in the table must be increased by 4.1%.

FIGS. 4a and 4b also show, in dotted lines, the location of the objective lens LO of the microscope in its conventional configuration.

When adjusting the instrument it is necessary to finely adjust the orientation of the specimen E. For this reason it is expedient for it to be carried by the specimen holder PE at the eucentric plane thereof. The deflecting coils DF1, DF2 are designed so as to direct the electron beam to a position centered on the specimen E when the latter is located in the eucentric plane of the specimen, this being so independently of the angle of inclination of the incident beam. In other words, the pivot point of the deflector pair must be able to be brought into the eucentric plane of the specimen holder PE.

An electromagnetic lens L1 is positioned downstream of the sample E in the direction of propagation of the electron beam, at a distance $d_1 > 0$ from the latter. This lens is supposed to provide a relatively low magnification, typically between 3 and 20, and preferably between 5 and 10, in order to allow a sufficiently wide field of view to be obtained. To do this, it must have an optimum focal length $f_{opt}$, i.e. minimizing aberrations, relatively long, i.e. greater than or equal to 5 mm, preferably between 5 and 30 mm, and more preferably still between 10 and 20 mm. For comparison, the main objective lens of a conventional electron microscope typically has a focal length of around 1 mm.

To recall, if f is the focal length of the lens L1, the magnification of the specimen E is given by $f/(d_1-f)$. This means that the distance $d_1$ is of the same order of magnitude as the focal length f of the lens. The specimen is therefore spatially separated from the lens L1, whereas in a conventional electron microscope it is immersed in the magnetic field of the main objective lens.

The point-to-point spatial resolution $\rho$ of the instrument depends on both the wavelength of the electrons and the spherical aberration constant $C_s$, $\rho=0.67 C_s^{0.25} \lambda^{0.75}$.

The following table gives the value of $C_s$ (dimensionally the same as a length) as a function of the required resolution and the acceleration voltage of the electrons:

| | Acceleration voltage | | |
|---|---|---|---|
| Resolution | 80 kV | 200 kV | 300 kV |
| 0.5 nm | 4 mm | 20 mm | 40 mm |
| 1 nm | 6.8 cm | 31 cm | 65 cm |
| 2 nm | 1.1 m | 5.0 m | 10 m |
| 4 nm | 17 m | 80 m | 160 m |

For a point-to-point spatial resolution of 1 nm at 200 kV it is therefore necessary for $C_s$ to be a maximum of 31 cm. The spherical aberration constant is typically about the focal length of the lens. A $C_s$ from 10 cm to 1 m for lenses with a focal length of around 20 mm is possible. On this, see:

M. A. Schofield, M. Beleggia, Y. Zhu and G. Pozzi, "Characterization of JEOL 2100F Lorentz-TEM for Low-Magnification Electron Holography and Magnetic Imaging", Ultramicroscopy (2007), doi:10.1016/j.ultramic.2007.10.015.

E. Snoeck, P. Hartel. H. Mueller, M. Haider & P. C. Tiemeijer, "Using a CEOS-Objective Lens Corrector as a Pseudo Lorentz Lens in a Tecnai F20 TEM", Proc. IMC16 Sapporo (2006) CD.

The ultimate resolution limit is the information limit of the lens. This limit is typically larger than the point-to-point resolution limit. It is determined by the incoherence and the instabilities of the system. The most important factor is the chromatic aberration of the lens, in conjunction with the energy width of the electron source.

The lens L1 may be a Lorentz lens.

A diaphragm DL1 is positioned, adjustably and moveably, in the image focal plane of the lens L1 in order to cut the electron beam transmitted by the specimen to zero order, the scattered electrons and the higher orders of diffraction. Typically, it is necessary to cut the beams at angles (in relation to the plane of the specimen) of around 1 mrad from the optical axis AO. In the image focal plane, the beams at an angle θ appear at a distance of f times θ from the optical axis, where f is the focal length of the lens L1. As the focal length of the lens L1 is longer than that of a conventional objective lens, the aperture of the diaphragm DL1 will itself also be greater than that of a conventional diaphragm. Centering this diaphragm will therefore be simpler.

Downstream of the diaphragm DL1, and upstream of the plane of the image of the specimen formed by the lens L1 (plane PI1) there is a conventional single or multiple biprism BP.

FIG. 4a shows a second electromagnetic lens L2 situated downstream of the biprism BP and of the image plane PI1. This lens may have a dual function:
first, it makes it possible to form an image of the focal plane of L1 so as to be able to locate the diaphragm; and
second, it makes it possible to form the image of the image plane PI1 in a second image plane PI2 so as to produce a hologram.

Downstream of this second lens there are conventional projector lenses LP which project the hologram produced in the plane PI2 onto the array detector SD.

According to the variant of FIG. 4b, the second lens L2 (which may be a set of lenses) may be placed upstream of the biprism. This configuration is advantageous as it makes it possible to rotate the image of the specimen relative to the biprism so as to obtain an effect equivalent to a physical rotation of the specimen itself or of the biprism, which is necessary in order to align the biprism parallel with the interface between the areas A and B. For mechanical reasons, it is preferable to rotate the image of the specimen rather than the biprism or the specimen itself: this is because there is a particular maximum stability orientation of the biprism or of the specimen relative to the microscope column. However, the magnification introduced by this second lens in front of the biprism is likely to limit the field of view.

Figure 5:
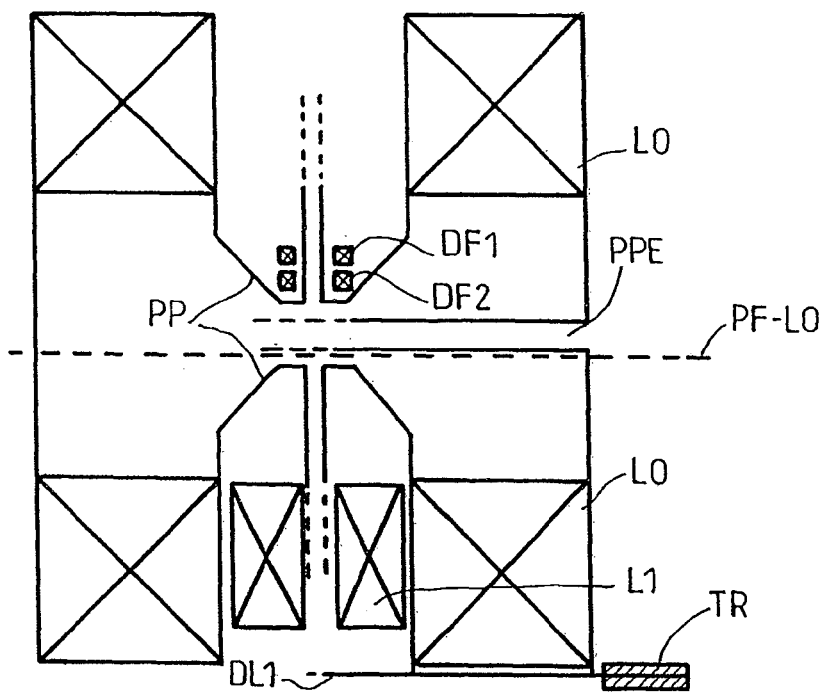
FIG. 5, an assembly capable of being introduced into the column of an existing electron microscope and bearing the essential elements of the electron optical device according to the invention.

FIG. 5 shows a "monolithic" assembly that may be introduced into a commercial electron microscope, replacing its main objective lens so as to adapt it to implement the holographic technique for measuring crystal deformations described above. This assembly essentially consists of the pair of deflecting coils DF1 and DF2, the objective lens LO provided with a passage PPE into which a conventional specimen holder and a diaphragm DLO may be inserted into its focal plane (the focal length of the objective lens is so short that the focal plane is located inside the lens itself), the lens L1 and the associated diaphragm DL1, mounted on a translator TR. Because of its large size, the objective lens LO advantageously constitutes the common structural element to which all the other components of the assembly are connected. In particular, the deflectors are situated immediately upstream of the pole pieces of said objective lens, while the first lens L1 is situated inside the windings of the objective lens, downstream of the region with a strong magnetic field (between the pole pieces).

A diaphragm (not shown) may also be provided in the focal plane PF-LO of the objective lens LO. In a manner known per se this focal plane lies inside the objective lens LO itself.

As a variant, it is possible to provide an assembly not comprising the objective lens LO and therefore not allowing a "conventional" imaging operation. In this case, the components DF, L1 and DL1 would be connected by a structural element which may, in particular, consist of the lens L1 itself.

In any event, the assembly of FIG. 5 may also comprise other elements such as the second lens L2 or the biprism BP if these components are not provided in the commercial electron microscope.

The device of FIGS. 4a, 4b and 5 has been described with reference to the method for measuring microscopic deformations according to the invention. However, it can equally be applied to other bright field holographic techniques requiring a relatively wide field of view. In particular, the diaphragm DL1 makes it possible to eliminate the electrons scattered at angles greater than that corresponding to the spatial resolution of the lens, thus improving the signal-to-noise ratio of the holographic fringes.

Figure 6:
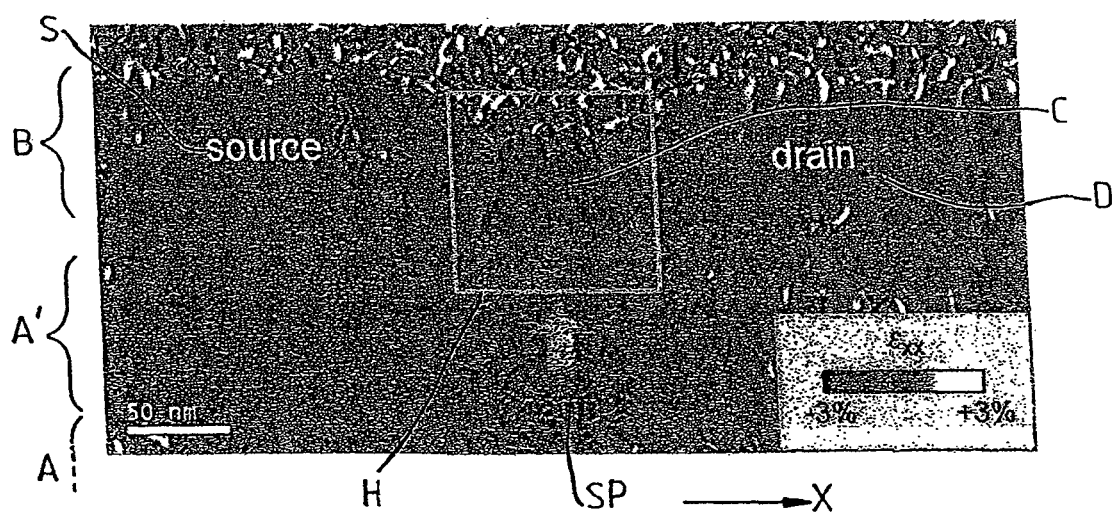
FIG. 6, the result of a measurement of crystal deformation in a transistor carried out according to the invention.

FIG. 6 shows an example of mapping of deformations—and more precisely of the component $\epsilon_{xx}$ of the deformation tensor—obtained by the method of the invention. The specimen consists of a slice of a MOSFET field effect transistor produced using strained silicon technology. It can be observed that the channel C of the transistor, between the source S and the drain D, is compressed by around 1.3% relative to the "deep" part SP of the substrate which serves as a reference. The square designated by H shows the visual field of the HRTEM technique. It can be seen that this technique does not allow the strained area and a reference area to be imaged at the same time: it therefore does not allow crystal deformation to be quantified, except by comparing several different images, which is likely to introduce unacceptable measurement errors.

In a measurement carried out according to the invention, the field of view is typically around 2 μm parallel to the interface between the areas A' and B, and around 250 nm perpendicular to said interface. But wider fields of view, for example up to 4 μm×2 μm, may be obtained. The spatial resolution is of the order of several nanometers, typically from 2 to 4. The displacement fields and the deformation tensors may be measured with a precision depending on the spatial resolution. For example, with a resolution of 4 nm a precision of around 0.2% may be expected, and with a resolution of 2 nm a precision of around 0.4%.

The technique may be used to map the deformations in specimens of different kinds: microelectronic devices, as in the case of FIG. 6, but also slices of a thin-film system or coatings deposited on a substrate, a damaged or disturbed area of a crystal specimen, an interface region between two crystals, etc. Moreover, the reference and measurement areas do not necessarily have to be in direct contact with one another: it is also possible to imagine putting two crystals alongside one another on a suitable specimen holder such as a carbon film.

The invention claimed is:

1. A method for measuring nanoscale deformations in a measurement area of a crystal specimen, comprising:
   i) providing a crystal specimen in a form of a wafer with approximately parallel faces, said crystal specimen comprising a measurement area, of which crystal deformations are to be measured, and a reference area, wherein the reference area is assumed to be without deformations and is coplanar with the measurement area;
   ii) illuminating one face of said specimen with a spatially coherent beam of radiation capable of being diffracted by a crystal lattice of the specimen;
   iii) superposing a first beam of radiation diffracted by the measurement area of the specimen with a second beam of the same radiation diffracted, to the same order, by the reference area so as to cause these two diffracted beams to interfere at an image plane;
   iv) measuring spatial periodicity and orientation of fringes of a resulting interference pattern; and
   v) deducing a difference in a lattice parameter and/or orientation between said reference area and the measurement area, said difference in lattice parameter and/or orientation being indicative of a state of deformation of the measurement area at a nanoscale.

2. The method as claimed in claim 1, wherein superposing two beams of said radiation diffracted by said reference and measurement areas comprises the step of using a biprism beam deflection device.

3. The method as claimed in claim 2, also comprising:
   vi) a calibration step comprising measuring the change in direction of the diffracted beam(s) introduced by said deflection device; and
   using information obtained during step v) of determining a difference in the lattice parameter between said reference and measurement areas.

4. The method as claimed in claim 3, where, during said calibration step:
   vi-a) two spatially distinct parts of the same beam diffracted by only one of said areas of the specimen are superposed to cause them to interfere at said image plane; and
   vi-b) measurement is carried out of the spatial periodicity and the orientation of the fringes of the resultant interference pattern, which constitute the calibration information sought.

5. The method as claimed in claim 3, where, during said calibration step:
   vi-a') a coherent radiation beam is generated which is approximately identical to that used for the crystal deformation measurement;
   vi-b') using said deflection device a nondiffracted component of said beam is decomposed into two parts that are superposed and interfere at said image plane;
   vi-c') measurement is carried out of the spatial periodicity and the orientation of the fringes of the interference pattern, which constitute the calibration information sought.

6. The method as claimed in claim 3, wherein determining a difference in the lattice parameter between said reference and measurement areas comprises:
   calculating, from the measurement of the spatial periodicity and the orientation of the interference fringes, a difference between the components of the wave vectors of the beams diffracted by the measurement area and by the reference area;
   determining, during said calibration step vi), a component of a wave vector representing the deflection introduced by said device; and
   subtracting of said component of the wave vector representing the deflection introduced by said device from said difference between the components of the wave vector of the diffracted beams;
   which yields as a result a difference between the components of reciprocal crystal lattice vectors of said reference and measurement areas, indicative of a deformation in the measurement area at the nanoscale.

7. The method as claimed in claim 1, in which said or each step of measuring the spatial periodicity of interference fringes comprises:
   iv-a) acquiring an image of the interference pattern at said image plane;
   iv-b) converting said image into a digital format; and
   iv-c) determining periodicity of said fringes by an image processing method.

8. The method as claimed in claim 7, in which said image processing method is a geometrical phase analysis method.

9. The method as claimed in claim 1, further comprising repeating steps ii) to v) a second time, using the first and second beams diffracted according to diffraction vectors that are not collinear with the diffraction vectors of the first measurement, in order to determine a two-dimensional deformation tensor for the measurement area of said specimen.

10. The method as claimed in claim 9, further comprising repeating steps ii) to v) a third time, using the first and second beams diffracted according to diffraction vectors that are not coplanar with the diffraction vectors of the first and second measurement, in order to determine a three-dimensional deformation tensor for the measurement area of said specimen.

11. The method as claimed in claim 1, in which the specimen is approximately transparent to the spatially coherent beam and a forward diffraction of said spatially coherent beam is used for the measurement.

12. The method as claimed in claim 1, in which the spatially coherent beam used comprises an electron beam.

13. A system for measuring nanoscale deformations in a portion of a crystal specimen, said system comprising:
   a support for a crystal specimen in the form of a wafer with approximately parallel faces;
   an illuminator for illuminating one face of said specimen with a spatially coherent beam of radiation capable of being diffracted by a crystal lattice of the specimen;
   an optical assembly for superposing a beam of radiation diffracted by a first area of the specimen with a beam of the same radiation diffracted, to the same order, by a second area, coplanar with said first area, so as to cause these two diffracted beams to interfere at an image plane; and
   an array detector coupled with a data processor for measuring the spatial periodicity of fringes of a resulting interference pattern and calculating, from said spatial periodicity, a difference in a lattice parameter between said first and second areas of the specimen, which is indicative of a state of deformation of one of these areas relative to the other at a nanoscale.

14. A machine for measuring nanoscale deformations in a measurement area of a crystal specimen, comprising:
   circuitry configured to:
      i) illuminate one face of a crystal specimen with a spatially coherent beam of radiation capable of being diffracted by a crystal lattice of the specimen, said crystal specimen being in a form of a wafer with approximately parallel faces, and having a measurement area, of which crystal deformations are to be measured, and a reference area, wherein the reference area is assumed to be without deformations and is coplanar with the measurement area;
      ii) superpose a first beam of radiation diffracted by the measurement area of the specimen with a second beam of the same radiation diffracted, to the same order, by the reference area so as to cause these two diffracted beams to interfere at an image plane;
      iii) measure spatial periodicity and orientation of fringes of a resulting interference pattern; and
      iv) deduce a difference in a lattice parameter and/or orientation between said reference area and the measurement area, said difference in lattice parameter and/or orientation being indicative of a state of deformation of the measurement area at a nanoscale.

* * * * *

UNITED STATES PATENT AND TRADEMARK OFFICE
CERTIFICATE OF CORRECTION

PATENT NO.        : 8,502,143 B2
APPLICATION NO.   : 12/680078
DATED             : August 6, 2013
INVENTOR(S)       : Hytch et al.

Page 1 of 1

It is certified that error appears in the above-identified patent and that said Letters Patent is hereby corrected as shown below:

In the Claims:

Column 14,
Claim 9, line 67, "collinear" should read --colinear--.

Signed and Sealed this
Twelfth Day of November, 2013

Teresa Stanek Rea
*Deputy Director of the United States Patent and Trademark Office*